US005486754A

United States Patent [19]
Cruden et al.

[11] Patent Number: 5,486,754
[45] Date of Patent: Jan. 23, 1996

[54] ELECTRIC CURRENT MEASUREMENT

[75] Inventors: Andrew J. Cruden, Lennoxtown; James R. McDonald, Newton Mearns; Ivan Andonovic, Bearsden; Kenneth Allan, Erskine; Raymond A. Porrelli, East Kilbride, all of Scotland

[73] Assignee: Instrument Transformers Limited, Glasgow, Scotland

[21] Appl. No.: 256,713

[22] PCT Filed: Jan. 22, 1993

[86] PCT No.: PCT/GB93/00134

§ 371 Date: Jul. 21, 1994

§ 102(e) Date: Jul. 21, 1994

[87] PCT Pub. No.: WO93/15410

PCT Pub. Date: Aug. 5, 1993

[30] Foreign Application Priority Data

Jan. 29, 1992 [GB] United Kingdom ............... 9201896

[51] Int. Cl.$^6$ ................................................. G01R 31/00
[52] U.S. Cl. ....................................................... 324/96
[58] Field of Search ................................ 324/96, 117 H; 250/336.1

[56] References Cited

U.S. PATENT DOCUMENTS 5,149,962  9/1992  Maurice ................................. 324/96

FOREIGN PATENT DOCUMENTS 0081367  6/1983  European Pat. Off. .
1453330  4/1987  U.S.S.R. .

OTHER PUBLICATIONS

Abstract—Appln. No. 56–139026; Issued Mar. 8, 1983; for "Measuring Apparatus Of Electric Current"; Japan.
Abstract—Appln. No. 89—213114; Issued 23 Jan. 1989; for "High Voltage"; Great Britain.
Abstract—Appln. No. 55–112585; Issued Feb. 26, 1982; for "Current Measuring Device"; Japan.

"Proceedings Of The Institution Of Electrical Engineers"; vol. 125; Oct. 1978 pp. 935–941; A. M. Smith.

Primary Examiner—Kenneth A. Wieder
Assistant Examiner—Kourosh Cyrus Khosravi
Attorney, Agent, or Firm—Bell, Seltzer, Park & Gibson

[57] ABSTRACT

An electrical current measuring device, for measuring the current in an electrical conductor (11), includes first and second measurement channels. Each of these channels includes a sensor (12) adapted to be located adjacent the conductor (11) and coupled via optical fibers (14,16) to source circuitry (18) and detector circuitry (20). The sensor (12) incorporates a material (22) which exhibits the Faraday magneto-optic effect and the source circuitry (18) is arranged to deliver an unpolarized light signal which is subsequently polarized by a first polarizer (23) to enable a linearly polarized light signal to be incident to the material (22). The quantum of rotation in the plane of polarization imposed on the signal emerging from the material (22) is monitored via a second polarizer (24) by the detector circuitry (20) as a measure of the electrical current flowing in the conductor (11). The sensor material (22) of the first channel has a Verdet constant which is more temperature sensitive than that of the sensor material of the second channel. In addition, each measurement channel is arranged to maintain a constant light intensity incident on its detector circuitry (20), and gain-control circuitry (17,19) is provided at the outputs of the two measurement channels to deliver to an output terminal a modified measure of the sensed electrical current which is compensated against temperature variations.

6 Claims, 3 Drawing Sheets

ELECTRIC CURRENT MEASUREMENT

This invention relates to the measurement of electric current using optical techniques.

The measurement of electrical current is conventionally undertaken by current transformers utilising an iron core with a toroidal winding but a number of disadvantages arise from these devices which lead to operational incompatabilities with modern compact medium or high voltage electrical systems.

The present invention provides a current measuring device comprising a sensor which is coupled via optical fibres to source and detection circuitry and which incorporates a material exhibiting the Faraday magneto-optic effect, the source being arranged to deliver an unpolarised light signal which is subsequently polarised by a first polariser to enable a linearly polarised light signal to be incident on the material, the quantum of rotation in the plane of polarisation imposed on the signal emerging from the material being monitored via a second polariser as a measure of the electrical current flowing through an electrical conductor located adjacent the material.

It is preferred that the sensor comprises a module releasably connected to the optical fibres, the module incorporating a length of magneto-optic crystal material with the first and second polarisers respectively separating the ends of the crystal material from first and second graded-index lenses each arranged to function as a collimator.

Preferably also the module is located within a housing of known dimensions whereby the crystal material can be disposed at a known distance from the adjacent electrical conductor by abutment of the housing against the conductor. Such abutment may be achieved by hand-held or cable clipped means.

The module may be one of a plurality of such modules forming the sensor, different modules having different crystal materials and/or different lengths of crystal material or more than one crystal material whereby different ranges of measurement can be provided and, additionally, inherent temperature and vibration compensation can be achieved.

It is preferred that the optical fibres are of the multi-mode type with non-conducting connectors for attachment to the sensor. The source circuitry preferably includes one or more light-emitting diodes and the detector circuitry preferably includes one or more photo diodes. With this arrangement both the source and the detector components can be selected to be wavelength compatible with the crystal material of the sensor to permit optimal operation of the device. By way of example if the crystal material is YIG (Yttrium Iron Garnet) it is preferred that both the source and detector components operate at a wavelength of about 1300 nm whereas if the crystal material is either TGG (Terbium Gallium Garnet) or BSO (Bismuth Silicate) is is preferred that both the source and detector components operate at a wavelength of about 880 nm.

Embodiments of the present invention will now be described by way of example with reference to the accompanying drawings, in which;

FIG. 1 schematically illustrates a basic form of sensing device in accordance with the present invention;

Figure 1:
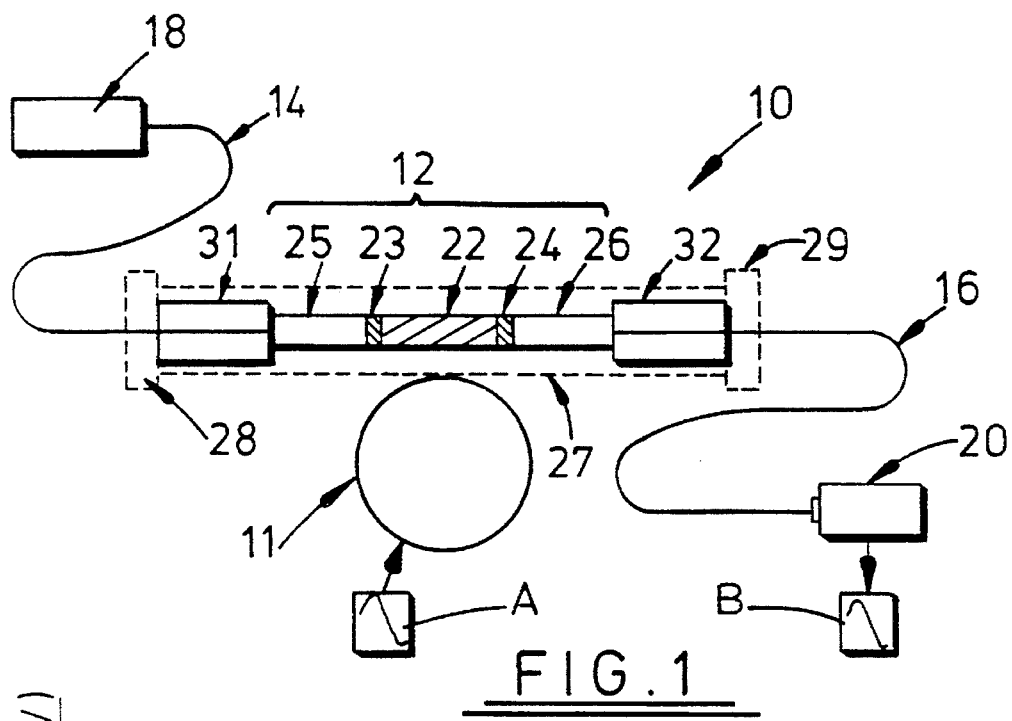

Turning now to the drawings in more detail, FIG. 1 illustrates a basic form of current sensing device 10 for measuring the electrical current in an adjacent electrical conductor 11. Device 10 comprises a sensor 12 which is elongate being essentially in the form of a rod which at its ends is coupled via optical fibres 14,16 to source circuitry 18 and detector circuitry 20. Because the sensor 12 is elongate it does not extend around or encircle the conductor 11 and is therefore 'unlinked' with the conductor.

Sensor 12 comprises a length of magneto-optic crystal material 22 (which exhibits the Faraday magneto-optic effect) with first and second polarisers 23, 24 separating the ends of the length 22 from first and second graded index lenses 25,26 each of which is preferably of quarter pitch so as to function as a collimator. The sensor 12 forms a module having a housing 27 (shown in phantom) of known dimensions whereby the spacing of the length 22 from the conductor 11 is predetermined and known when the module is abutted against the conductor. The housing 27 is preferably made of a ceramic or polymer which maintains the insulation integrity in the region near the conductor and is non-interacting with the magnetic field established by the current flowing in the conductor 11, and at each end terminates in an optical connector 28,29 for releasable connection to similar connectors formed at the ends of the fibres 14,16. Fibres 14,16 are of the multi mode type and at the connectors 28,29 the fibres 14,16 are strengthened by glass capillaries 31,32 internal to the housing.

The source circuitry 18 is formed by a light emitting diode which propagates an unpolarised light signal along fibre 14 to lens 25 which functions as a collimator thereby permitting essentially uniform distribution of the light prior to conditioning by the polarisers 23,24 and the crystal material length 22. Polariser 23 causes the device to deliver a linearly polarised light beam to the crystal material length 22 while polariser 24, which typically is set with its transmission axis biassed at 45° with respect to that of polariser 23, converts the Faraday rotation induced by the magnetic field associated with the current carrying conductor 11 to an intensity modulated signal which is delivered by fibre 16 to a photo diode forming detector 20. Typically the sinusoidal nature of the current in conductor 11 is as shown at inset 'A' whilst the corresponding intensity variation signal received by the detector 20 is as shown at inset 'B'.

The dynamic range of the device is related to the crystal type employed in the material length 22, the crystal length itself, and to the wavelength of light propagating through it. The Verdet constant of the material expressed in radians/ampere-tunr gives a measure of the Faraday rotation per unit of electrical current which produces the magnetic field strength and is wavelength dependent. At low wavelengths the Verdet constant is relatively high, decreasing non-linearly as the wavelength increases.

The choice of crystalline material for length 22 is dependent on a number of factors. The Verdet constant determines the length requirement for length 22 and also current threshold level for a particular application and dynamic range of the device. A dynamic range of greater than 60 dB (10 A to 10,000 A) is attainable. Typically the length 22 is in the form of a crystalline rod of a nominal 2 millimeter diameter of length 5 millimeters for YIG, 15 millimeters for TGG and 30 millimeters for BSO.

The source circuitry 18 and the detector circuitry 20 although shown separately in FIG. 1 may be combined into a single unit and screened so as to be immune from external EMI and of course preventing emission of EMI. The device 10 is compact in size and is low in weight and can be retrofitted to an existing cable conductor 11 since it is unlinked. It can be used in hazardous environments and is free of hazardous electrical phenomena (e.g. arcing) because it operates on an optical basis. The source circuitry 18 may incorporate one or more specific wavelength light emitting diodes and the detector circuitry 20 may incorporate one or more photo diodes whereby both source and detector can be tuned to provide optimal efficiency for a particular material length 22. Length 22 is effectively interchangeable due to the modular design and as previously mentioned the sensor head 12 may incorporate more than one length of crystalline material.

The detector circuitry 20 may be organised with an auto-ranging facility so that the source circuitry 18 can deliver to a secondary crystalline length when the measurement limit of a first crystalline length is exceeded. Additionally the sensor head 12 may inherently provide temperature compensation to the device 10 having regard to the fact that most of the crystalline materials previously referred to change their properties as a function of temperature, caused by their different magnetic characteristics. Typical graphs of Verdet constant versus temperature for TGG and BSO crystal materials are shown in FIG. 2.

Figure 2:
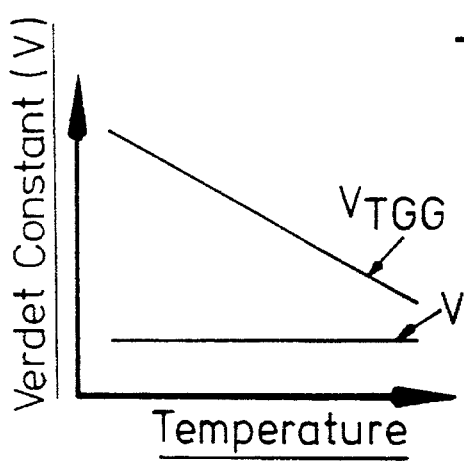
FIG. 2 illustrates Verdet characteristics as a function of temperature for two different crystal materials which may be used in the FIG. 1 device.
Figure 4:
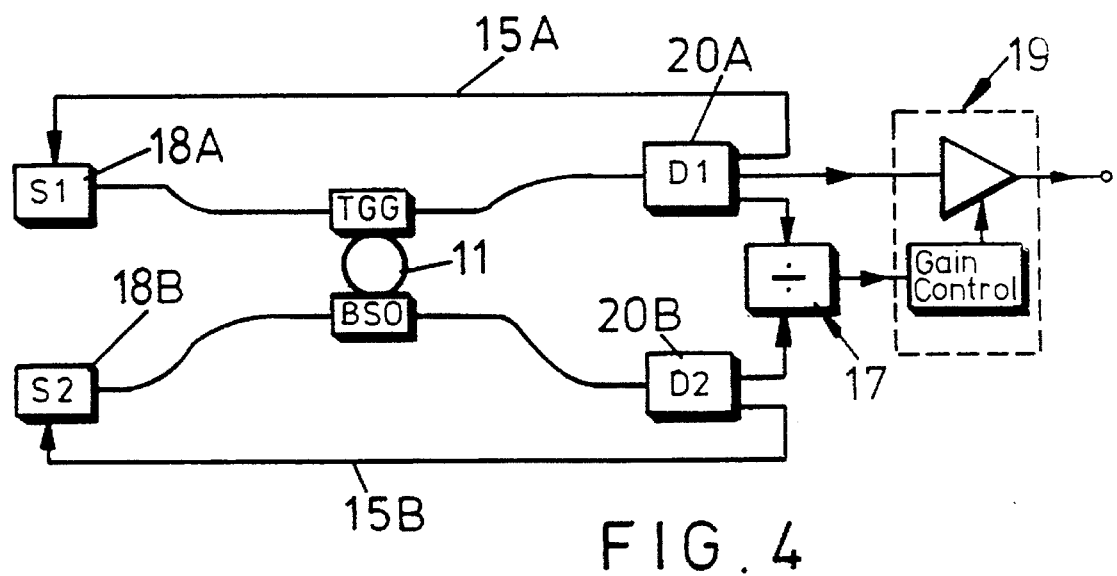
FIG. 4 illustrates a dual channel sensing device in accordance with the present invention for compensating against temperature effects.

A method for compensation against the effect of Verdet constant change with temperature has been developed based on the different temperature characteristics of TGG and BSO crystals, the latter being comparatively insensitive to temperature change and of comparatively low value as illustrated in FIG. 2. This method consists of using two separate sensing devices 10A, 10B, one using TGG and the other using BSO in association with the same electrical conductor 11 in the manner shown in FIG. 4. Each device 10A, 10B incorporates an electronic feedback signal 15A, 15B from the detector circuitry 20A, 20B to its respective source circuitry 18A, 18B. The purpose of this feedback signal is to maintain a constant light intensity incident upon the photodiode of the detector circuitry 20A, 20B. This feedback signal is a D.C. signal and thus does not attempt dynamic compensation for the 50 Hz modulation induced due to Faraday rotation arising from the 50 Hz current flowing in conductor 11.

Figure 3:
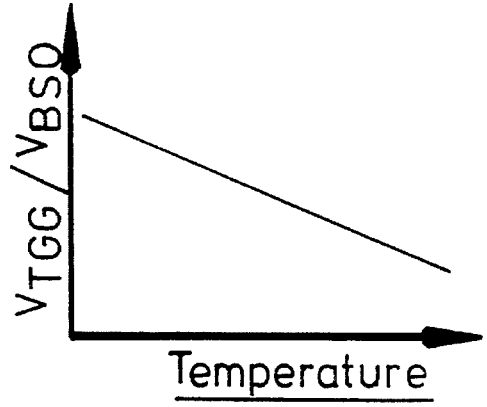
FIG. 3 illustrates the ratio of the FIG. 2 Verdet constants as a function of temperature.

The two detector circuits 20A, 20B produce two measures of the current flowing in the conductor 11. These are divided (by divider 17) to produce a ratio of the two measures, and from the known ratio characteristic shown in FIG. 3, this ratio determines the temperature of the two crystals. This value of ratio is then used to control an automatic gain function of an amplifier 19 to modify the measurement output from the detector circuitry 20A of the device 10A with the TGG material (since its Verger constant is comparatively large in value but particularly temperature sensitive). The gain control adjustment is determined with reference to a calibration procedure when at a first known temperature a predetermined current level $I_1$ is passing through the conductor 11 and the gain control is set at unity to produce a calibration measurement result from amplifier 19. The temperature only is then changed to a second known value which produces a modified calibration measurement result. The gain control is adjusted to return the measurement result from amplifier 19 to the original calibration measurement level. The amount of adjustment required to achieve this for the difference in temperature between the first and second values is thereafter proportionally used during measurement of an unknown current value in conductor 11 to compensate for the temperature determined from the FIG. 3 characteristic with respect to the first known temperature value, which is the reference temperature.

A further source of measurement errors which requires compensation is due to vibration effects on the optical cables 14, 16 leading to and from the housing 27. These vibration effects introduce optical losses in the system and are manifested by noise in the output signal from the detector circuitry 20. To compensate for these effects a dual wavelength scheme has been developed, shown in FIG. 5.

Figure 5:
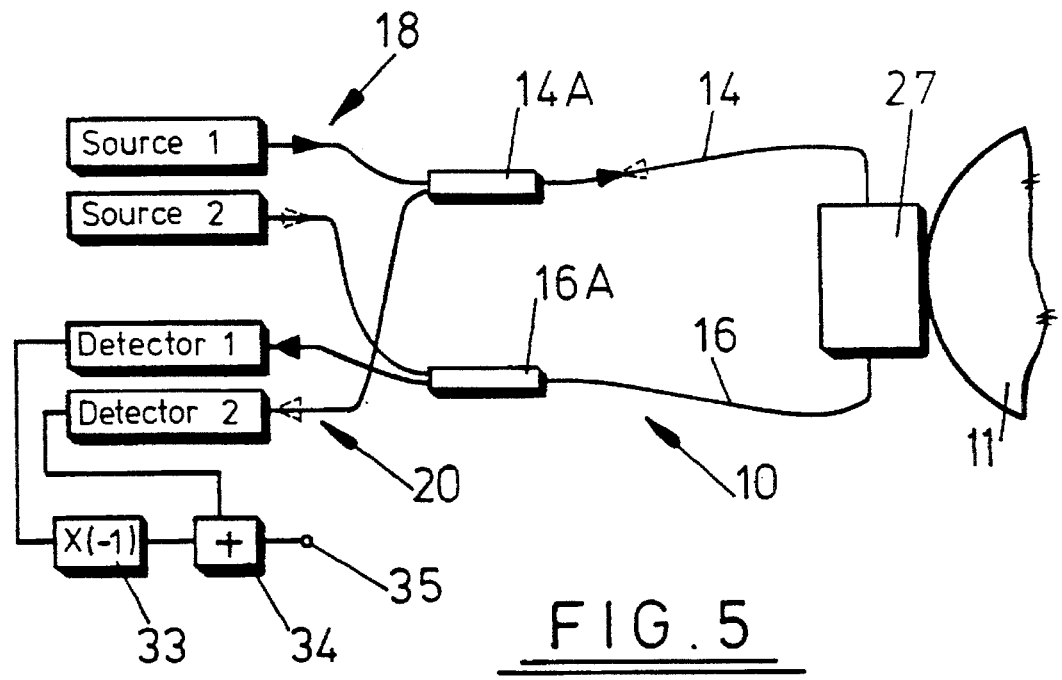
FIG. 5 illustrates a dual wavelength sensing device in accordance with the present invention for compensating against vibration effects.

In FIG. 5 there is only one sensing device 10 but two different wavelengths $\lambda_1$ and $\lambda_2$ from sources S1, S2 are propagated through the optical system in opposite directions using optical couplers 14A, 16A in the fibres 14, 16 to correspondingly sensitive detectors D1, D2. Due to the wavelength difference, for example, $\lambda_1$=850 nm, $\lambda_2$=1300 nm, there is no interference between the two optical signals. It should be noted that the Faraday rotation influence on both signals produces rotations which are exactly out of phase with each other; vibration effects on the other hand cause error signals that remain in phase with other. Thus, by inverting one of the measurement signals, usually the 1300 nm signal, and adding this signal in a fixed ratio to the 850 nm signal by means of components 33, 34, the two Faraday rotation signals add together in phase, and the vibration effects cancel. This method, therefore, cancels vibration effect errors and increases the amplitude of the Faraday rotation signal provided at output 35 for any length of magneto-optic crystal.

The Verdet constant of the crystal, as has been previously described is wavelength dependent which means that V decreases non-linearly as wavelength increases. Owing to this fact, both the $\lambda_1$ and $\lambda_2$ signals can be propagated in the same direction and effective compensation against vibration can still be achieved. However in this case the Faraday rotation signals require to be subtracted rather than added because both propagate in the same direction.

The optical crystal based current sensor devices which have been described are primarily magnetic field sensors, but are calibrated to give a current measurement from the electrical conductor of interest. Due to this the devices are susceptible to external magnetic fields from neighbouring electrical conductors which may cause measurement errors to be present by virtue of "cross-talk".

Figure 6:
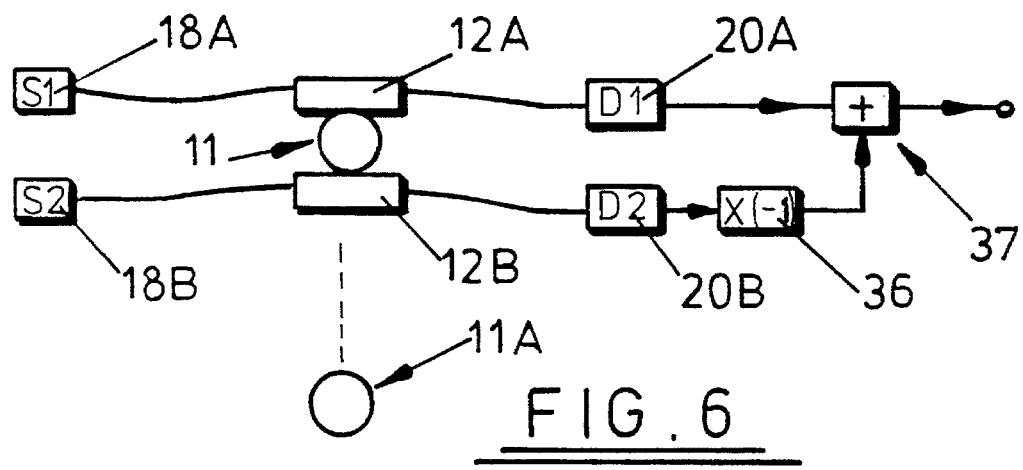
FIG. 6 illustrates a dual channel sensing device in accordance with the present invention for compensating against cross-talk effects from neighbouring conductors.

To compensate for these cross-talk effects two crystal sensors 12A, 12B are preferred as shown in FIG. 6, positioned on opposite sides of the electrical conductor 11 so that the magnetic field seen by the two sensors 12A, 12B from the central conductor 11 will be in different directions whereas the magnetic field from a neighbouring conductor 11A may be assumed to be in the same direction for both sensors 12A, 12B and of approximately equal magnitudes. It will be apparent therefore, that by inverting the signal from one of the detector's outputs and adding it to the other, the effect of the external magnetic field will be cancelled whilst the output signals produced by the magnetic field of the central conductor 11 will add. This is achieved by components 36 and 37.

Figure 7:
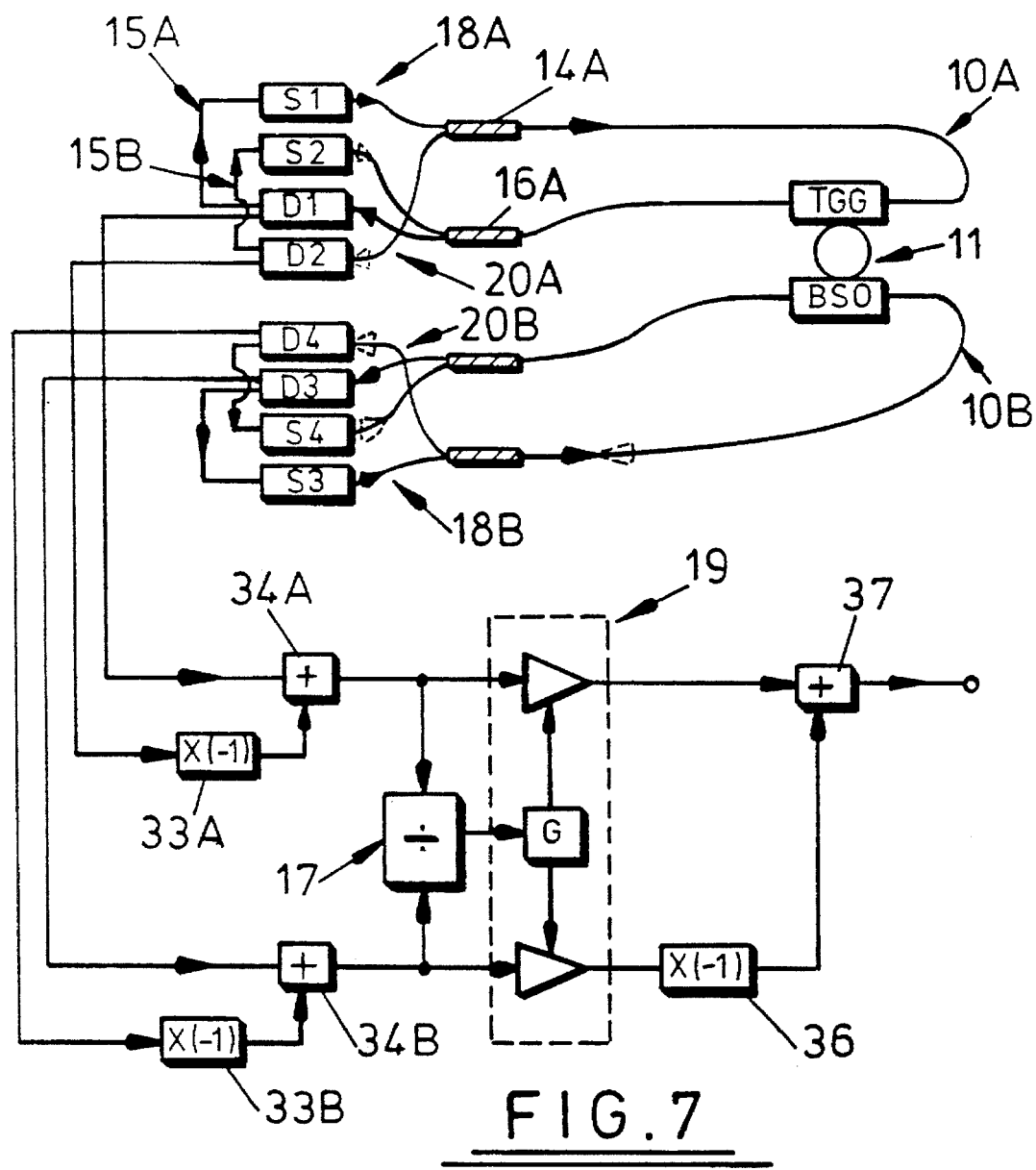
FIG. 7 illustrates a dual channel dual wavelength sensing device in accordance with the present invention providing compensation against the combined effects of temperature, vibration and cross-talk..

The optical crystal based electric current sensing device 10 aims to replace conventional iron-cored current transformers (CT) and must, therefore, comply with all existing C.T. standards. To achieve these accuracy standards all of the above compensation schemes will need to be implemented in the one device. Such a device is schematically illustrated in FIG. 7.

We claim:

1. An electrical current measuring device, for measuring the current in an electrical conductor (11), comprises first and second measurement channels, each channel comprising a sensor (12) adapted to be located adjacent the conductor (11) and coupled via optical fibres (14,16) to source circuitry (18) and detector circuitry (20), the sensor (12), incorporating a material (22) which exhibits the Faraday magneto-optic effect and the source circuitry (18) being arranged to deliver an unpolarised light signal which is subsequently polarised by a first polariser (23) to enable a linearly polarised light signal to be incident to the material (22) and the quantum of rotation in the plane of polarisation imposed on the signal emerging from the material (22) being monitored via a second polariser (24) by the detector circuitry (20) as a measure of the electrical current flowing in the conductor (11), wherein the sensor material (22) of the first channel is different from the sensor material (22) of the second channel, having a Verdet constant which is more temperature sensitive than that of the second channel;

each measurement channel is arranged to maintain a constant light intensity incident on its detector circuitry (20), and gain-control circuitry (17,19) is provided at the outputs of the two measurement channels to deliver to an output terminal a modified measure of the sensed electrical current which is compensated against temperature variations, the gain control circuitry (17,19) comprising a gain-controllable amplifier connected to the output of the detector circuitry (20) of the first channel, a divider (17) connected to the outputs of the respective detector circuitry (20) of the first and second channels for computing the ratio of said signals, means for comparing the computed ratio with pre-stored data (FIG. 3) representative of known signal ratios achieved under known constant currents but varying temperatures whereby to evaluate a proportionality measure with respect to temperature, and means for applying said proportionality measure to gain control the gain-controllable amplifier to provide the modified measure of the sensed electrical current from the detector circuitry (20) of the first channel.

2. A device as claimed in claim 1, wherein in each measurement channel the sensor (12) comprises a module releasably connected to the optical fibres (14,16), the module incorporating a length of magneto-optic crystal material (22) with the first and second polarisers (23,24) respectively separating the ends of the crystal material (22) from first and second graded index lenses (25,26) each arranged to function as a collimator.

3. A device as claimed in claim 1, wherein the second channel comprises magneto-optic effect material in the form of Bismuth Silicate (BSO) and the first channel comprises magneto-optic effect material in the form of Terbium Gallium Garnet (TGG).

4. A device as claimed in claim 1, wherein in at least one of said measurement channels said source circuitry (18) is dual wavelength, said detector circuitry (20) is dual wavelength, and said optical fibres (14,16) are arranged to cause both wavelengths to be incident on said material (22), and computation means (33,34) is provided at the discrete wavelength outputs of the detector circuitry (20) to combine the output signals from said at least one measurement channel to eliminate measurement errors due to vibration effects on the fibres (14,16).

5. A device as claimed in claim 4, wherein the respective wavelengths are arranged to counter propagate through the material (22) in said at least one measurement channel and the computation means (33,34) is arranged to invert one discrete wavelength output and add it to the other discrete wavelength output.

6. A device as claimed in claim 1, wherein the sensor (12) in at least one of said measurement channels is one of a pair of similar sensors (12A,12B) connected to respective source circuitry (18A,18B) and detector circuitry (20A,20B), the sensors (12A,12B) being spaced apart for location on either side of the electrical conductor (11) where current is to be measured, and arithmetic means (36,37) is provided at the outputs of the detector circuitry (20A,20B) to combine these outputs after inversion of one to provide from said at least one measurement channel a measure of electrical current flow in the conductor (11) which is free from error due to cross-talk.

* * * * *